US010937575B2

(12) United States Patent
Kirk et al.

(10) Patent No.: US 10,937,575 B2
(45) Date of Patent: Mar. 2, 2021

(54) CASCADE VARISTOR HAVING IMPROVED ENERGY HANDLING CAPABILITIES

(71) Applicant: AVX Corporation, Fountain Inn, SC (US)

(72) Inventors: Michael Kirk, Simpsonville, SC (US); Marianne Berolini, Greenville, SC (US); Palaniappan Ravindranathan, Simpsonville, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 16/291,037

(22) Filed: Mar. 4, 2019

(65) Prior Publication Data

US 2019/0304636 A1   Oct. 3, 2019

Related U.S. Application Data

(60) Provisional application No. 62/638,369, filed on Mar. 5, 2018.

(51) Int. Cl.
*H01C 7/10* (2006.01)
*H05K 1/16* (2006.01)
*H02H 9/02* (2006.01)
*H01C 7/18* (2006.01)

(52) U.S. Cl.
CPC .............. *H01C 7/10* (2013.01); *H01C 7/18* (2013.01); *H02H 9/02* (2013.01); *H05K 1/167* (2013.01)

(58) Field of Classification Search
CPC .............. H01C 7/10; H01C 7/18; H02H 9/02
(Continued)

(56) References Cited

U.S. PATENT DOCUMENTS

| 4,556,929 A | 12/1985 | Tanaka et al. |
| 4,726,991 A * | 2/1988 | Hyatt ................... H01B 7/2813 428/329 |

(Continued)

FOREIGN PATENT DOCUMENTS

| JP | 2002305127 A | 10/2002 |
| JP | 2005216955 A | 8/2005 |
| KR | 20170110456 A | 10/2017 |

OTHER PUBLICATIONS

Product Catalog for AVX Transient Suppression Products, 152 pages.

(Continued)

*Primary Examiner* — Edwin A. Leon
*Assistant Examiner* — Iman Malakooti
(74) *Attorney, Agent, or Firm* — Dority & Manning, P.A.

(57) ABSTRACT

A varistor is provided having a rectangular configuration defining first and second opposing end surfaces offset in a lengthwise direction. The varistor may include a first terminal adjacent the first opposing end surface and a second terminal adjacent the second opposing end surface. The varistor may include an active electrode layer including a first electrode electrically connected with the first terminal and a second electrode electrically connected with the second terminal. The first electrode may be spaced apart from the second electrode in the lengthwise direction to form an active electrode end gap. The varistor may include a floating electrode layer including a floating electrode. The floating electrode layer may be spaced apart from the active electrode layer in a height-wise direction to form a floating electrode gap. A ratio of the active electrode end gap to the floating electrode gap may be greater than about 2.

17 Claims, 4 Drawing Sheets

(58) Field of Classification Search
USPC .......................................................... 338/21
See application file for complete search history.

(56) References Cited

U.S. PATENT DOCUMENTS

| | | | |
|---|---|---|---|
| 5,245,309 A | 9/1993 | Kawase et al. | |
| 6,052,272 A | 4/2000 | Kuroda et al. | |
| 6,087,923 A | 7/2000 | Ahn et al. | |
| 6,134,098 A | 10/2000 | Kuroda et al. | |
| 6,147,587 A | 11/2000 | Hadano et al. | |
| 6,608,547 B1 | 8/2003 | Grier et al. | |
| 6,619,763 B2 | 9/2003 | Trinh et al. | |
| 6,661,638 B2 | 12/2003 | Jackson et al. | |
| 6,760,215 B2 | 7/2004 | Devoe | |
| 7,135,955 B2 | 11/2006 | Feichtinger et al. | |
| 7,541,910 B2 | 6/2009 | Lien et al. | |
| 7,589,953 B2 | 9/2009 | Togashi et al. | |
| 7,710,233 B2 | 5/2010 | Feichtinger et al. | |
| 8,125,765 B2 | 2/2012 | Ishida et al. | |
| 8,179,210 B2 | 5/2012 | Feichtinger | |
| 8,730,648 B2 | 5/2014 | Wozniak et al. | |
| 8,780,523 B2 | 7/2014 | Seo et al. | |
| 9,490,072 B2 | 11/2016 | Bultitude et al. | |
| 2011/0205725 A1* | 8/2011 | Demcko | H01C 1/14 361/821 |
| 2013/0100576 A1* | 4/2013 | Seo | H01G 4/30 361/301.4 |

OTHER PUBLICATIONS

Product Information for AntennaGuard/SPV, AVX Ultra-Low Capacitance Multilayer Varistors, ESD Protection for any Circuit Sensitive to Capacitance from AVX Corporation, Aug. 2, 2016, pp. 55-56.

Product Information for AntennaGuard 0402/0603, AVX Low Capacitance Multilayer Varistors, ES Protection for Antennas and Low Capacitor Loading Applications from AVX Corporation, May 3, 2016, pp. 48-51.

Product Information for AntennaGuard 0402/0603, Automotive Series, AVX Low Capacitance Automotive Varistors, ESD Protection for Automotive Circuits Sensitive to Capacitance from AVX Corporation, Aug. 2, 2016, pp. 52-54.

Product Information for Glass Encapsulated SMD Varistor MLV (VJ12, 20, 13, 14, 15, 32). Transient Voltage Suppression, ESD Protection Devices & EMI Devices from AVX Corporation, pp. 96-107.

Product Information for Antenna PowerGuard, AVX Low Capacitance Varistors, ESD Protection for Circuits Sensitive to Capacitance from AVX Corporation, Jan. 3, 2017, pp. 55-57.

Press Release—AVX Antenna PowerGuard Products Provide Reliable ESD Protection in Capacitance-Sensitive Applications, Jul. 19, 2017, 3 pages.

Product Information—Surface Mount Multilayer Ceramic Chip Capacitors (SMD MLCCs), Floating Electrode Design with Flexible Termination System (FF-CAP), X7R Dielectric, 6.3-250 VDC (Commercial and Automotive Grade) from KEMET Electronics Corporation, Oct. 14, 2016, pp. 1-22.

Paper from Automotive Electronics Council (AEC-Q200-002-REV-B entitled "Human Body Model Electrostatic Discharge Test," Jun. 1, 2010, pp. 1-14.

International Search Report and Written Opinion for PCT/US2019/020501 dated Jun. 18, 2019, 11 pages.

Prevallet et al., "High Voltage Considerations with MLCs," 2004 IEEE—*International Power Modulator Symposium and High Voltage Workshop*, San Francisco, 4 pages.

* cited by examiner

CASCADE VARISTOR HAVING IMPROVED ENERGY HANDLING CAPABILITIES

CROSS REFERENCE TO RELATED APPLICATION

The present application claims filing benefit of U.S. Provisional Patent Application Ser. No. 62/638,369 having a filing date of Mar. 5, 2018, which is incorporated herein by reference in its entirety.

BACKGROUND OF THE INVENTION

The present subject matter generally relates to electronic components adapted to be mounted on a circuit board and more particularly to a varistor and varistor array.

Multilayer ceramic devices, such as multilayer ceramic capacitors or varistors, are typically constructed with a plurality of stacked dielectric-electrode layers. During manufacture, the layers may often be pressed and formed into a vertically stacked structure. Multilayer ceramic devices can include a single electrode or multiple electrodes in an array.

Varistors are voltage-dependent nonlinear resistors and have been used as surge absorbing electrodes, arresters, and voltage stabilizers. Varistors may be connected, for example, in parallel with sensitive electrical components. The non-linear resistance response of varistors is often characterized by a parameter known as the clamping voltage. For applied voltages less than the clamping voltage of a varistor, the varistor generally has very high resistance and, thus, acts similar to an open circuit. When the varistor is exposed to voltages greater than its clamping voltage, however, its resistance is reduced such that the varistor acts more similar to a short circuit and allows a greater flow of current. This non-linear response may be used to divert current surges and/or prevent voltage spikes from damaging sensitive electronic components.

For some time, the design of various electronic components has been driven by a general industry trend toward miniaturization. Miniaturization of electronic components has resulted in lower operating currents and reduced durability. The current and energy handling ability of a varistor is generally limited by heat generated by current flow. If too great of a current flows through a varistor, the varistor will overheat, causing damage such as melting, burning, etc.

Thus, a compact varistor having improved energy handling capabilities would be desirable.

SUMMARY OF THE INVENTION

In accordance with one embodiment of the present disclosure, a varistor may have a rectangular configuration defining first and second opposing end surfaces offset in a lengthwise direction. The varistor may include a first terminal adjacent the first opposing end surface and a second terminal adjacent the second opposing end surface. The varistor may include an active electrode layer including a first electrode electrically connected with the first terminal and a second electrode electrically connected with the second terminal. The first electrode may be spaced apart from the second electrode in the lengthwise direction to form an active electrode end gap. The varistor may include a floating electrode layer including a floating electrode. The floating electrode layer may be spaced apart from the active electrode layer in a height-wise direction to form a floating electrode gap. A ratio of the active electrode end gap to the floating electrode gap may be greater than about 2.

In accordance with another embodiment of the present disclosure, a varistor may include a first terminal, a second terminal, and a plurality of active electrode layers. Each of the plurality of active electrode layers may be electrically connected with at least one of the first terminal or second terminal. The varistor may include a plurality of floating electrode layers interleaved with the plurality of active electrode layers in a cascade configuration. A capacitance of the varistor may be less than about 100 µF.

In accordance with another embodiment of the present disclosure, a varistor may include a first terminal, a second terminal, and a plurality of active electrode layers. Each of the plurality of active electrode layers may be electrically connected with at least one of the first terminal or second terminal. The varistor may include a plurality of floating electrode layers interleaved with the plurality of active electrode layers in a cascade configuration. A specific transient energy capability of the varistor may be greater than about $1 \times 10^7$ J/m$^3$.

BRIEF DESCRIPTION OF THE DRAWINGS

A full and enabling disclosure of the present subject matter, including the best mode thereof, directed to one of ordinary skill in the art, is set forth in the specification, which makes reference to the appended Figures, in which.

Figure 1A:
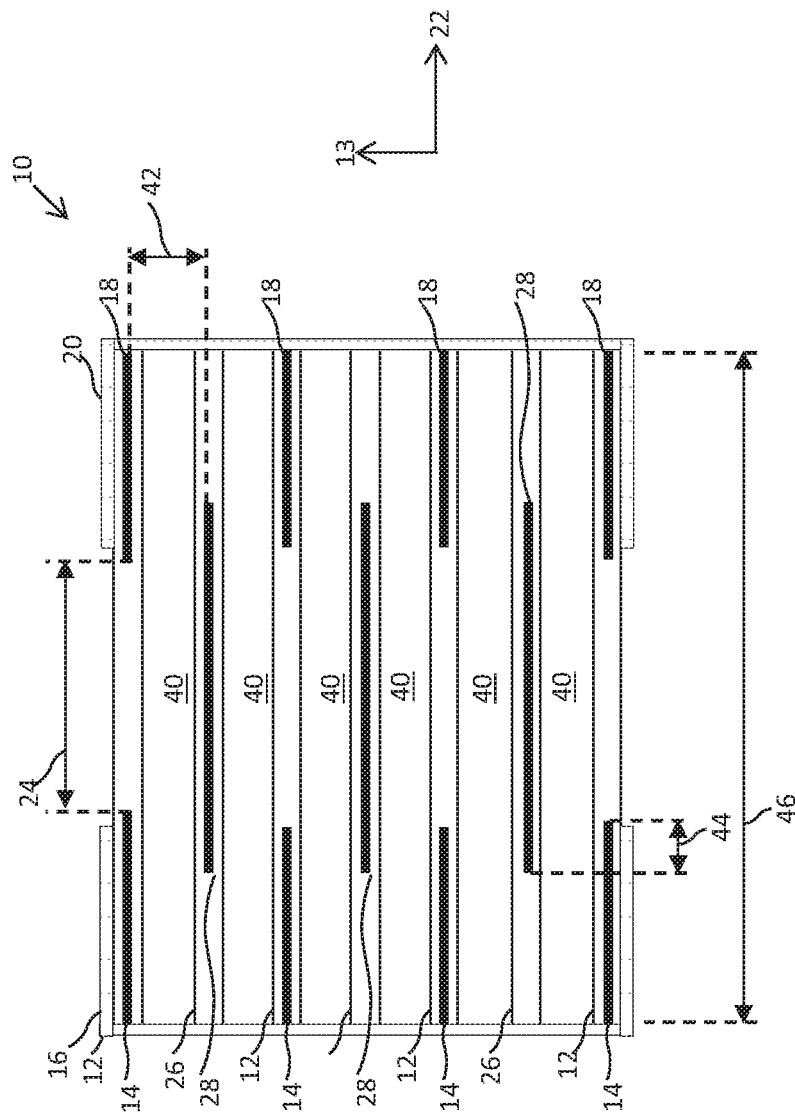
FIGS. 1A-1C illustrate various views of one embodiment of a varistor in accordance with aspects of this disclosure.

Repeat use of reference characters throughout the present specification and appended drawings is intended to represent same or analogous features, electrodes, or steps of the present subject matter.

DETAILED DESCRIPTION OF THE PREFERRED EMBODIMENTS

It is to be understood by one skilled in the art that the present disclosure is a description of exemplary embodiments only, and is not intended as limiting the broader aspects of the present subject matter, which broader aspects are embodied in the exemplary constructions.

Generally, the present disclosure is directed to a cascade varistor. The varistor may have excellent energy dissipation characteristics. For example, a transient energy capability of the varistor may be represented by electrostatic discharge (ESD) repetitive strike handling capability, transient energy capability, and/or specific transient energy capability (energy per unit volume). Additionally, according to aspects of the present disclosure, the varistor can also exhibit several other desirable characteristics, including a low capacitance (making the varistor especially suited for capacitance-sensitive circuits) and a low leakage current at a working voltage of the varistor.

The varistor may include a rectangular configuration defining first and second opposing end surfaces that are offset in a lengthwise direction. The varistor may include a first terminal adjacent the first opposing end surface and a second terminal adjacent the second opposing end surface. The varistor may also include an active electrode layer including a first electrode electrically connected with the first terminal and a second electrode electrically connected with the second terminal. The first electrode may be spaced apart from the second electrode in the lengthwise direction to form an active electrode end gap. The varistor may include a floating electrode layer comprising a floating electrode. The floating electrode layer may be spaced apart from the active electrode layer in a height-wise direction to form a floating electrode gap. A ratio of the active electrode end gap to the floating electrode gap may be greater than about 2.

Without being limited to theory, the above-described cascade configuration may facilitate increased energy handling capabilities. For example, at voltages greater than a breakdown voltage of the varistor, the floating electrode(s) may improve electrical conduction between the terminals. Yet, for voltages below the breakdown voltage, the floating electrode(s) may not impair performance of the varistor. Moreover, the floating electrode(s) may improve heat conduction in the lengthwise direction, thereby improving heat dissipation. During a large current/energy surge, heat is generated as current flows through the dielectric layers. The floating electrode layer(s) may facilitate improved heat flow from the middle of the dielectric layers outwards towards the terminals where the heat may be more easily dissipated. As a result the varistor may be capable of handling a greater energy surge without overheating. Thus, the floating electrode layer(s) may improve the energy handling capabilities of the varistor.

The dielectric layers may be pressed together and sintered to form a unitary structure. The dielectric layers may include any suitable dielectric material, such as, for instance, barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, titatnium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 10 microns to 100 microns, in some embodiments, from about 20 microns to 80 microns.

The terminals and electrodes of the varistor may be formed from a variety of electrically conducting materials. Example conducting materials include palladium, silver, platinum, and copper. Any other suitable conductor capable of being printed on the dielectric layer may be used to form the electrodes and/or terminals.

Regardless of the particular configuration employed, the present inventors have discovered that through selective control over the configuration of the electrodes and the ratio of the active electrode end gap to the floating electrode gap, a varistor can be achieved that exhibits excellent energy handling capabilities. In some embodiments, the ratio of the active electrode end gap to the floating electrode gap may be greater than about 2. For example, in some embodiments, the ratio may range from about 2 to about 50, in some embodiments from about 2 to about 30, and in some embodiments from about 3 to about 25.

The active electrode end gap may range from about 100 microns to about 1000 microns, and in some embodiments from about 200 microns to about 800 microns. The floating electrode gap may range from about 15 microns to about 300 microns, and in some embodiments from about 25 microns to about 150 microns.

As indicated above, the varistor may exhibit excellent energy handling capabilities. For example, the varistor may have a transient energy capability, as determined by a 10×1000 microsecond pulse, that is greater than about 0.01 Joules, in some embodiments greater than about 0.03 Joules, and in some embodiments greater than about 0.04 Joules. For example, in some embodiments, the transient energy capability may range from about 0.02 to about 0.04 Joules.

Additionally, the varistor may be compact, resulting in excellent specific transient energy capabilities. For example, the specific transient energy capability of the varistor may be greater than $6 \times 10^7$ Joules/cubic meter ($J/m^3$). In some embodiments, the specific transient energy capability may range from about $1 \times 10^7$ $J/m^3$ to about $20 \times 10^7$ $J/m^3$, in some embodiments from about $1.5 \times 10^7$ $J/m^3$ to about $10 \times 10^7$ $J/m^3$, and in some embodiments from about $2 \times 10^7$ $J/m^3$ to about $7 \times 10^7$ $J/m^3$.

In some embodiments, a varistor according to aspects of the present disclosure may be capable of withstanding repetitive electrostatic discharge strikes without substantial degradation in performance. For example, a breakdown voltage of the varistor after 5,000 or more electrostatic discharge strikes of about 8,000 volts may be greater than about 0.9 times an initial breakdown voltage of the varistor, in some embodiments greater than about 0.95 times the initial breakdown voltage, and in some embodiments greater than about 0.98 times the initial breakdown voltage.

In some embodiments, a varistor in accordance with aspects of this disclosure may also exhibit low capacitance. For example, the varistor may have a capacitance less than about 100 picoFarads ("pF"). For example, in some embodiments, the varistor may have a capacitance less than about 50 pF, in some embodiments less than about 20 pF, and in some embodiments less than about 10 pF. For example, in some embodiments, the varistor may have a capacitance ranging from about 0.1 pF to about 20 pF, in some embodiments from about 0.1 pF to about 10 pF, in some embodiments from about 0.7 pF to about 5 pF, and in some embodiments from about 0.1 pF to about 1 pF.

In some embodiments, the varistor may exhibit a low leakage current. For example, the leakage current at an operating voltage of about 30 volts may be less than about 10 microamperes (pA). For example, in some embodiments, the leakage current at an operating voltage of about 30 volts may range from 0.01 pA to about 5 pA, in some embodiments, from about 0.005 pA to about 1 pA, in some embodiments, from about 0.05 pA to about 0.15 pA, e.g., 0.1 pA.

Figure 1B:
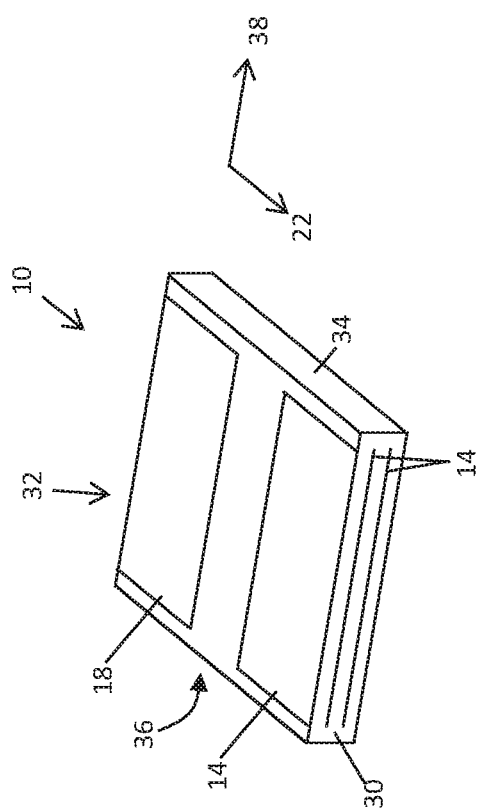
Figure 1C:
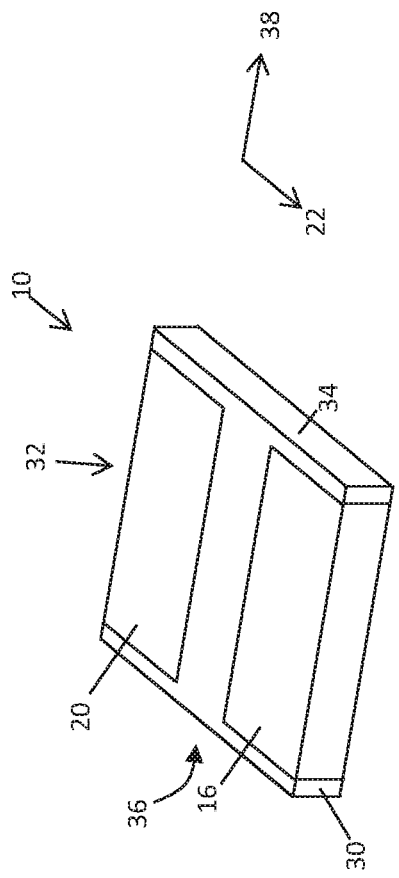

Referring now to the figures, exemplary embodiments of the present disclosure will now be discussed in detail. FIGS. 1A-1C illustrate one embodiment of a varistor 10 in accordance with aspects of the present disclosure. FIG. 1A is a schematic section view showing the various layers of one embodiment of the varistor 10. In one embodiment, the varistor 10 may include a plurality of generally planar dielectric layers made of, for example, a ceramic dielectric material, as described above.

Referring to FIG. 1A, the varistor 10 may include a plurality of active electrode layers 12 stacked in a Z direction 13. Each active electrode layer 12 may include a first electrode 14 electrically connected with a first terminal 16 and a second electrode 18 electrically connected with a second terminal 20. Each first electrode 14 may be spaced apart from a respective second electrode 18 within the same active electrode layer 12 in a lengthwise direction 22 to form an active electrode end gap 24. The lengthwise direction 22 may generally be perpendicular to the height-wise direction 13.

The varistor 10 may also include a plurality of floating electrode layers 26. The plurality of floating electrode layers 26 may be arranged in an alternating configuration (e.g., interleaved) between respective pairs of active electrode layers 12. Each floating electrode layer 26 may include a floating electrode 28. In some embodiments, the floating electrodes 28 may not be directly electrically connected with any external structure. For example, the floating electrodes 28 may be electrically disconnected from the terminals 16, 20. In some embodiments, the floating electrodes 28 may be generally disposed in the middle of the floating electrode layers 26 with respect to the lengthwise direction 22. For example, the floating electrode layers 26 may be disposed approximately an equal distance in the lengthwise direction 22 from each of the first terminal 16 and second terminal 20.

In some embodiments, the varistor 10 may also include a plurality of dielectric layers 40. For example, the dielectric layers 40 may be disposed, in an alternating fashion, between the active electrode layers 12 and floating electrode layers 26. Although illustrated as disposed between each active electrode layer 12 and adjacent floating electrode layer 26, in some embodiments, the dielectric layers 40 may be disposed between less than all of the active electrodes layers 12 and adjacent floating electrode layers 26. Additionally, in some embodiments, each of the dielectric layers 40 may have approximately the same thickness. However, in other embodiments, the dielectric layers 40 may have varying thicknesses such that the distance between floating electrodes 28 and adjacent active electrodes 16, 18 may vary within the varistor 10.

The floating electrode layers 26 may be spaced apart from the adjacent active electrode layers 12 in the height-wise direction 13 to form a floating electrode gap 42. As indicated above, in some embodiments, a ratio of the active electrode end gap 24 to the floating electrode gap 42 may greater than about 2.

Additionally, in some embodiments, the first electrode 14 and/or second electrode 18 may overlap the floating electrode 28 in the longitudinal direction 22 along an overlap distance 44. The active electrode layer 12 may have a length 46 in the lengthwise direction 22 between the first terminal 16 and the second terminal 20. An overlap ratio may be defined as the length 46 of the active electrode layer 12 divided by the overlap distance 44. As indicated above, in some embodiments, the overlap ratio may be greater than about 5. Capacitance may be formed along the overlap distance 44 between the first and second electrodes 14, 18 and the floating electrode 28. Thus, having an overlap ratio greater than about 5 may reduce such capacitance without significantly reducing the energy dissipating capabilities of the varistor 10. In other embodiments, however, the first and second electrodes 14, 18 may not overlap the floating electrode layer 28 whatsoever. In yet other embodiments, the overlap ratio can be less than about 5.

It should also be understood that the present disclosure is not limited to any particular number of dielectric-electrode layers. For instance, in some embodiments, the varistor 10 may include 2 or more dielectric-electrode layers, 4 or more dielectric-electrode layers, 8 or more dielectric electrode layers, 10 or more dielectric-electrode layers, 20 or more dielectric-electrode layers, 30 or more dielectric-electrode layers, or any suitable number of dielectric-electrode layers.

Referring to FIGS. 1B and 1C, the varistor 10 may have a first end surface 30. Although not shown from the viewpoint of FIGS. 1B and 1C, it should be understood that the varistor 10 may include a second end surface 32 opposite the first end surface 30 and offset in the lengthwise direction 22. The varistor 10 may also have a first side surface 34, and although not shown from the viewpoint of FIGS. 1B and 1C, it should be understood that the varistor may include a second side surface 36 opposite the first side surface 34 and offset in a widthwise direction 38 that is perpendicular to the lengthwise direction 22.

FIG. 1B illustrates the varistor 10 without terminals (e.g., before the terminals are formed on the varistor 10). In some embodiments, a top layer of the varistor 10 may include exposed active first and second electrodes 14, 18. The edges of the first electrodes 14 may extend to the first end surface 30, and the edges of the second electrodes 18 may extend to the second end surface 32 to connect with the terminals 16, 20. Additionally, in other embodiments, the first and second electrodes 16, 18 may also extend to the side surfaces 34, 36 to provide improved connection with the terminals, which may be configured to warp around the side surfaces in such embodiments.

Referring to FIG. 1C, the varistor 10 may include termination structures for electrically connecting the active electrodes 14, 18 of varistor 10 to a circuit (e.g., on a printed circuit board). The termination structures may include the first terminal 16 and second terminal 20. The first and second terminals 16, 20 may include a metallization layer of platinum, copper, palladium silver, or other suitable conductor material. A chromium/nickel layer, followed by a silver/lead layer, applied by typical processing techniques such as sputtering, can be used as an outer conductive layer for the termination structures.

As illustrated in FIG. 1C, the first terminal 16 may be disposed on the first end surface 30 of the varistor 10 such that it is electrically connected with the first electrodes 14. In other words, the first electrodes 14 may electrically connect with the first terminal 16 at the first end surface 30. The second terminal 20 may electrically connect with the second terminal 20 at the second end surface 32.

In some embodiments, a top dielectric layer and/or bottom dielectric layer of the varistor 10 may include dummy electrodes. Dummy electrodes may improve mechanical adhesion of the terminals 16, 20 to the varistor 10 without substantially contributing to the electrical properties of the varistor 10. For example, the dummy electrodes may be shorter in the lengthwise direction 22 than the active electrodes 14, 18. Dummy electrodes may be formed in any dielectric layer 40 to improve electrical connection with the terminals 14, 18 and/or improve formation of the terminals 14, 18 (e.g., through electroless and/or electrolytic plating, such as by using a fine copper termination process).

Applications

The varistor disclosed herein may find applications in a wide variety of devices. For example, the varistor may be used in radio frequency antenna/amplifier circuits. The varistor may also find application in various technologies including laser drivers, sensors, radars, radio frequency identification chips, near field communication, data lines, Bluetooth, optics, Ethernet, and in any suitable circuit.

The varistor disclosed herein may also find particular application in the automotive industry. For example, the varistor may be used in any of the above-described circuits in automotive applications. For such applications, passive electrical components may be required to meet stringent durability and/or performance requirements. For example, AEC-Q200 standards regulate certain automotive applications. A varistor according to aspects of the present disclosure may be capable of satisfying one or more AEX-Q200 tests, including for example, an AEX-Q200-002 pulse test.

Ultra-low capacitance varistors may find particular application in data processing and transmission technologies. For example, aspects of the present disclosure are directed to varistors exhibiting capacitance less than about 1 pF. Such varistors may contribute minimal signal distortion in high frequency data transmission circuits, for example.

The present disclosure may be better understood with reference to the following example.

EXAMPLES

As is known in the art, the case size of electronic devices may be expressed as a four digit code (e.g., XXYY), in which the first two digits (XX) are the length of the device in millimeters (or in thousandths of an inch) and the last two digits (YY) are the width of the device in millimeters (or in thousandths of an inch). For instance, common metric case sizes may include 2012, 1608, and 0603.

An exemplary 0402 case size varistor may exhibit a capacitance of 0.8 pF at 1 MHz. The 0402 case size varistor may have a working DC voltage of 15 volts, a breakdown voltage of 125 volts, and a leakage current at the working DC voltage of 100 nA.

According to aspects of the present disclosure, varistors may have a high specific energy capability. Exemplary high specific energy capability varistors are listed in the following table:

TABLE 1

High Specific Energy Capability Varistors

| DC Working Voltage (Volts) | AC Working Voltage (Volts) | Breakdown Voltage (Volts) | Clamping Voltage (Volts) | Transient Energy Rating (J) | Peak Current Rating (μA) | Cap (pF) | Case Size | Specific Energy (J/m$^3$) |
|---|---|---|---|---|---|---|---|---|
| 18 | 13 | 150-210 | 350 | 0.02 | 1 | 1.5 | 0402 | 6.7E+07 |
| 18 | 13 | 80-140 | 300 | 0.02 | 1 | 2 | 0402 | 6.7E+07 |
| 18 | 13 | 150-200 | 350 | 0.03 | 2 | 2 | 0603 | 2.6E+07 |
| 24 | 17 | 90-150 | 240 | 0.04 | 3 | 3.3 | 0603 | 3.5E+07 |
| 30 | 21 | 150-210 | 350 | 0.02 | 1 | 1.5 | 0402 | 6.7E+07 |
| 30 | 21 | 150-200 | 350 | 0.03 | 2 | 2 | 0603 | 2.6E+07 |
| 30 | 21 | 90-150 | 240 | 0.04 | 3 | 3.3 | 0603 | 3.5E+07 |

The listed DC working voltages and AC working voltages are not intended to limit the application of these exemplary varistors. Rather, they are merely indicative of ideal operating voltages. As shown in the table, the listed working voltages are well below the breakdown voltages such that the varistors may generally provide high resistances at their working voltages (e.g., effectively operating as an open circuit) to prevent undesirable current flow. For example, each of the above varistors has a current leakage of about 0.1 pA or less at the DC working voltage.

The 0402 varistors listed above may have active electrode end gaps that range from about 15 mils to about 20 mils and floating electrode gaps that range from about 1 to about 5 mils. As such, the ratios of the active electrode end gaps to the floating electrode gaps for these example 0402 varistors may range from about 3 to about 18.

The 0603 varistors listed above may have active electrode end gaps that range from about 22 mils to about 28 mils and floating electrode gaps that range from about 1 to about 5 mils. As such, the ratios of the active electrode end gaps to the floating electrode gaps for these example 0603 varistors may range from about 4 to about 23.

The following table provides information about exemplary ultra-low capacitance varistors in accordance with aspects of the present disclosure:

TABLE 2

Ultra-Low Capacitance Varistors

| Working Voltage (DC) | Working Voltage (AC) | Maximum Leakage Current (nA) | Capacitance (pF) | Test Frequency (MHz) | Case Size |
|---|---|---|---|---|---|
| ≤10 | 125 | <10 | 0.8 | 5800 | 402 |
| ≤15 | 125 | <10 | 0.8 | 5800 | 402 |
| ≤15 | 135 | <100 | 0.47 | 6700 | 402 |
| ≤18 | 135 | <5,000 | 0.7 | 10800 | 201 |

The listed capacitance values are measured at the test frequencies presented above. These exemplary ultra-low capacitance varistors may find particular application with data transmission and/or processing technologies.

Test Methods

The following sections provide example methods for testing varistors to determine various varistor characteristics.

Transient Energy Capability

Figure 2:
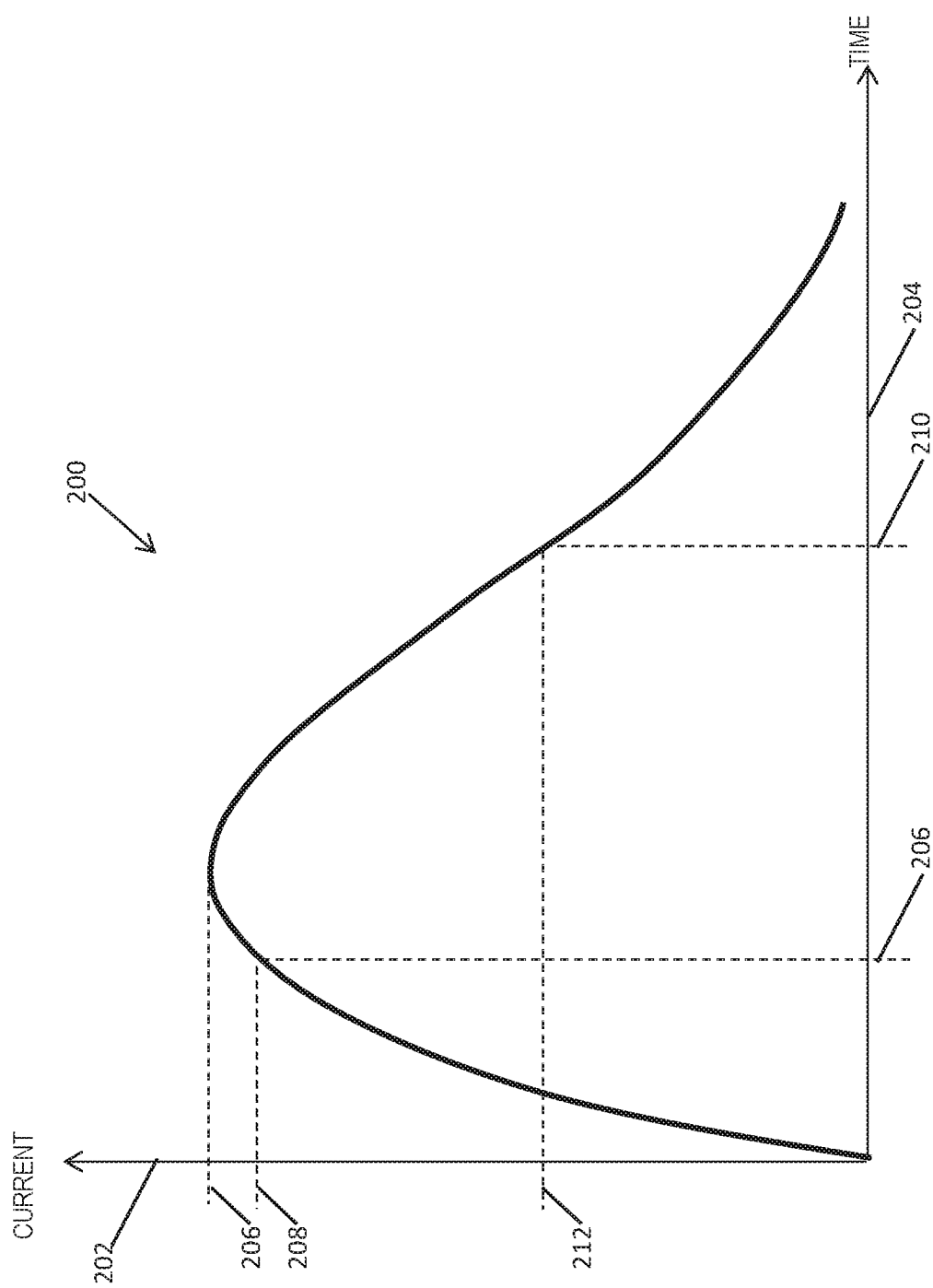
FIG. 2 illustrates an exemplary current pulse used to test various characteristics of the varistor in accordance with aspects of the present disclosure.

The transient energy capability of a varistor may be measured using a Keithley 2400 series Source Measure Unit (SMU), for example, a Keithley 2410-C SMU. The varistor may be subjected to a 10×1000 μs current wave. The peak current value may be empirically selected to determine the maximum energy that the varistor is capable of dissipating without failing (e.g., by overheating). An exemplary current wave is illustrated in FIG. 2. The current (vertical axis 202) is plotted against time (horizontal axis 204). The current increases to the peak current value 206 and then decays. The "rise" time period (illustrated by vertical dotted line 206) is from the initiation of the current pulse (at t=0) to when the current reaches 90% of the peak current value 206 (illustrated by horizontal dotted line 208). The "decay time" (illustrated by vertical dotted line 210) is from the initiation of the current pulse (at t=0) to when the current returns to 50% of the peak current value 206 (illustrated by horizontal dotted line 212). For a 10×1000 μs pulse, the "rise" time is 10 μs and the decay time is 1000 μs.

Figure 3:
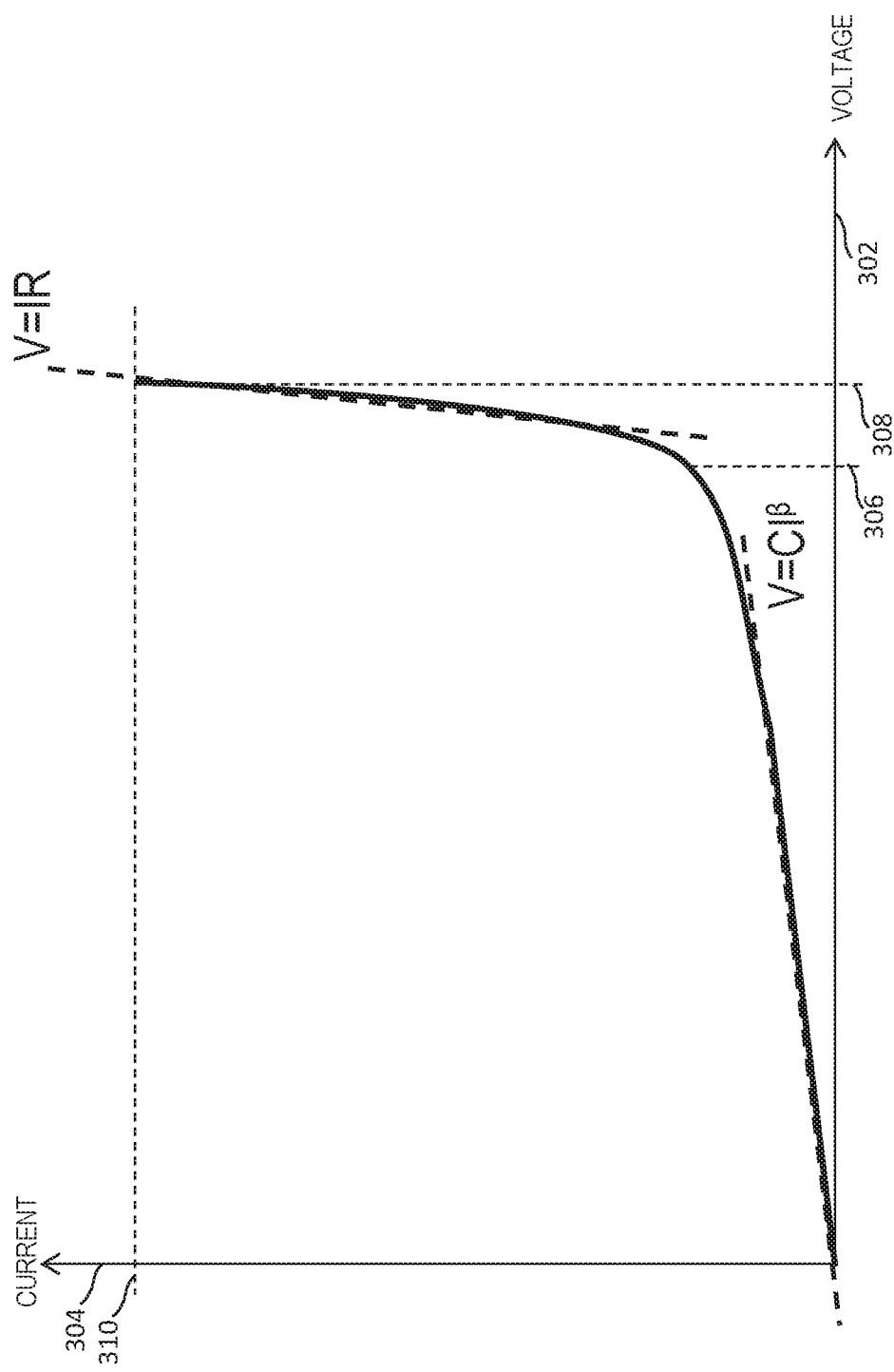
FIG. 3 illustrates current and voltage during an exemplary test of the varistor in accordance with aspects of the present disclosure.

During a pulse through the varistor, the voltage may be measured across the varistor. FIG. 3 illustrates an example plot of the voltage across the varistor (horizontal axis 302) against the current through the varistor (vertical axis 304). As shown in FIG. 3, once the voltage exceeds the breakdown voltage 306, additional current flow through the varistor does not significantly increase the voltage. In other words, the varistor "clamps" the voltage at approximately the clamping voltage 308.

The transient energy handling capability of the varistor 10 may be determined by calculating the amount of energy that has passed through the varistor 10. More specifically, the transient energy rating may be calculated by integrating the product of the measured current and the measured voltage with respect to time during the pulse:

$$E = \int IV dt$$

where E is the total energy dissipated by the varistor; I is the instantaneous current through the varistor; V is the instantaneous voltage across the varistor; and t represents time.

Additionally, to determine the electrostatic discharge capabilities of the varistor, a series of repetitive electrostatic discharge strikes may be administered. For example, 5,000 or more 8,000 volt electrostatic discharge strikes may be applied to the varistor. The breakdown voltage of the varistor may be measured (as described below) at regular intervals during this series of strikes. The breakdown voltage of the varistor after the electrostatic discharge strikes can be measured and compared with an initial breakdown voltage before the strikes.

Clamping and Breakdown Voltages

The clamping voltage of the varistor may be measured using a Keithley 2400 series Source Measure Unit (SMU), for example, a Keithley 2410-C SMU. Referring again to FIG. 3, the clamping voltage 308 may be accurately measured as the maximum voltage measured across the varistor during a 8×20 µs current pulse, in which the rise time is 8 µs, and the decay time is 20 µs. This remains true as long as the peak current value 310 is not so great that it damages the varistor.

The breakdown voltage 306 may be detected at as the inflection point in the current vs. voltage relationship of the varistor. Referring to FIG. 3, for voltages greater than breakdown voltage 306, the current may increase more rapidly with increasing voltage compared with voltages that are less than the breakdown voltage 306. For example, FIG. 3 represents a log-log plot of current against voltage. For voltages less than the breakdown voltage 306, an ideal varistor may generally exhibit voltages approximately according to the following relationship:

$$V = CI^{\beta}$$

where V represents voltage; I represents current; and C and β are constants that depend on the specifics of the varistor (e.g., material properties). For varistors, the constant β is generally less than 1 such that the voltage increases less rapidly than an ideal resistor according to Ohm's law in this region.

For voltages greater than the breakdown voltage 306, however, the current vs. voltage relationship may generally approximately follow Ohm's law, in which current is linearly related with voltage:

$$V = IR$$

in which, V represents voltage; I represents current; and R is a large constant resistance value. The current vs voltage relationship may be measured as described above, and any suitable algorithm may be used to determine the inflection point in the empirically collected current vs. voltage data set.

Peak Current Value

The peak current value that the varistor can handle without being damaged may be measured using a Keithley 2400 series Source Measure Unit (SMU) in a similar manner as described above regarding transient energy capability. The varistor may be subjected to successive 8×20 µs current pulses at increasing current levels. The peak current value may be empirically determined as the largest current value that can be pulsed through the varistor using an 8×20 µs current wave without damaging the varistor, for example through overheating.

Capacitance

The capacitance of the supercapacitors may be measured using a Keithley 3330 Precision LCZ meter with a DC bias of 0.0 volts, 1.1 volts, or 2.1 volts (0.5 volt root-mean-squared sinusoidal signal). The operating frequency is 1,000 Hz, unless otherwise specified in Table 2, above. The temperature is room temperature (~23° C.), and relative humidity is 25%.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A varistor having a rectangular configuration defining first and second opposing end surfaces offset in a lengthwise direction, the varistor comprising:
    a first terminal adjacent the first opposing end surface;
    a second terminal adjacent the second opposing end surface;
    an active electrode layer comprising a first electrode electrically connected with the first terminal and a second electrode electrically connected with the second terminal, the first electrode spaced apart from the second electrode in the lengthwise direction to form an active electrode end gap; and
    a floating electrode layer comprising a floating electrode, the floating electrode layer spaced apart from the active electrode layer in a height-wise direction to form a floating electrode gap;
    wherein a ratio of the active electrode end gap to the floating electrode gap is greater than about 2.

2. The varistor of claim 1, wherein:
    the first electrode overlaps the floating electrode in the longitudinal direction along an overlap distance;
    the active electrode layer has a length in the lengthwise direction between the first terminal and the second terminal; and
    an overlap ratio is greater than about 5.

3. The varistor of claim 1, wherein the floating electrode is disposed approximately an equal distance in the lengthwise direction from each of the first terminal and second terminal.

4. The varistor of claim 1, wherein a breakdown voltage of the varistor after 5,000 or more electrostatic discharge strikes of about 8,000 volts is greater than about 0.9 times an initial breakdown voltage of the varistor.

5. The varistor of claim 1, wherein a capacitance of the varistor is less than about 100 pF.

6. The varistor of claim 1, wherein a leakage current of the varistor is less than about 10 µA at about 30 volts.

7. The varistor of claim 1, wherein a transient energy capability of the varistor is greater than about 0.01 Joules.

8. The varistor of claim 1, wherein a specific transient energy capability of the varistor is greater than about $1\times10^7$ J/m$^3$.

9. A varistor comprising:
a first terminal;
a second terminal;
a plurality of active electrode layers, each of the plurality of active electrode layers electrically connected with at least one of the first terminal or second terminal; and
a plurality of floating electrode layers interleaved with the plurality of active electrode layers in a cascade configuration;
wherein a breakdown voltage of the varistor after 5,000 or more electrostatic discharge strikes of about 8,000 volts is greater than about 0.9 times an initial breakdown voltage of the varistor.

10. The varistor of claim 9, wherein a transient energy capability of the varistor is greater than about 0.01 Joules.

11. The varistor of claim 9, wherein a specific transient energy capability of the varistor is greater than about $1\times10^7$ J/m$^3$.

12. A varistor having a rectangular configuration defining first and second opposing end surfaces offset in a lengthwise direction, the varistor comprising:
a first terminal adjacent the first opposing end surface;
a second terminal adjacent the second opposing end surface;
an active electrode layer comprising a first electrode electrically connected with the first terminal and a second electrode electrically connected with the second terminal, the first electrode spaced apart from the second electrode in the lengthwise direction to form an active electrode end gap; and
a floating electrode layer comprising a floating electrode, the floating electrode layer spaced apart from the active electrode layer in a height-wise direction to form a floating electrode gap;
wherein:
the first electrode overlaps the floating electrode in the longitudinal direction along an overlap distance;
the active electrode layer has a length in the lengthwise direction between the first terminal and the second terminal; and
an overlap ratio is greater than about 5.

13. The varistor of claim 12, wherein a breakdown voltage of the varistor after 5,000 or more electrostatic discharge strikes of about 8,000 volts is greater than about 0.9 times an initial breakdown voltage of the varistor.

14. The varistor of claim 12, wherein a capacitance of the varistor is less than about 100 pF.

15. The varistor of claim 12, wherein a leakage current of the varistor is less than about 10 μA at about 30 volts.

16. The varistor of claim 12, wherein a transient energy capability of the varistor is greater than about 0.01 Joules.

17. The varistor of claim 12, wherein a specific transient energy capability of the varistor is greater than about $1\times10^7$ J/m$^3$.

* * * * *